United States Patent
Bai et al.

(10) Patent No.: US 11,520,225 B2
(45) Date of Patent: Dec. 6, 2022

(54) MASK AND METHOD FOR CORRECTING MASK PATTERNS

(71) Applicants: Semiconductor Manufacturing International (Shanghai) Corporation, Shanghai (CN); Semiconductor Manufacturing International (Beijing) Corporation, Beijing (CN)

(72) Inventors: Feng Bai, Shanghai (CN); Wanjuan Zhang, Shanghai (CN); Yingfang Wang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 246 days.

(21) Appl. No.: 17/030,075

(22) Filed: Sep. 23, 2020

(65) Prior Publication Data
US 2021/0208499 A1  Jul. 8, 2021

(30) Foreign Application Priority Data
Jan. 8, 2020 (CN) .......................... 202010018891.9

(51) Int. Cl.
*G03F 1/36* (2012.01)
*G03F 7/20* (2006.01)

(52) U.S. Cl.
CPC ............... *G03F 1/36* (2013.01); *G03F 7/705* (2013.01); *G03F 7/70441* (2013.01)

(58) Field of Classification Search
CPC ........ G03F 7/70441; G03F 7/705; G03F 1/36; G03F 1/72
See application file for complete search history.

(56) References Cited

U.S. PATENT DOCUMENTS

2018/0203342 A1\* 7/2018 Du ...................... G03F 7/70308

FOREIGN PATENT DOCUMENTS

CN              104166304 A  \* 11/2014

\* cited by examiner

*Primary Examiner* — Peter B Kim
(74) *Attorney, Agent, or Firm* — Anova Law Group, PLLC

(57) ABSTRACT

A method for correcting mask patterns includes providing a target layout, including a plurality of main patterns; dividing the target layout into a plurality of first regions along a first direction; acquiring position information of each first region of the plurality of first regions; acquiring a first model of each first region according to the position information of the first region; acquiring pattern parameters of auxiliary patterns around each main pattern of the first region; and arranging, around each main pattern, the auxiliary patterns of the main pattern according to the pattern parameters of the auxiliary patterns.

20 Claims, 5 Drawing Sheets

MASK AND METHOD FOR CORRECTING MASK PATTERNS

CROSS-REFERENCE TO RELATED APPLICATIONS

This application claims the priority of Chinese Patent Application No. CN202010018891.9, filed on Jan. 8, 2020, the entire content of which is incorporated herein by reference.

FIELD OF THE DISCLOSURE

The present disclosure generally relates to the field of semiconductor manufacturing and, more particularly, relates to methods for correcting mask patterns and a mask after pattern correction.

BACKGROUND

In semiconductor manufacturing, as the design size continues to shrink, the design size is close to or even smaller than the wavelength of the light used in lithography process. The diffraction effect and interference effect of light become more and more obvious, causing the formed photolithography patterns to be severely distorted as compared to the patterns on the mask.

In chip design, the density of chip patterns may be greatly arbitrary. That is, the chip patterns may be distributed densely or loosely from place to place. Theoretical and experimental results clearly show that the lithography process window for densely distributed patterns is different from the lithographic process window for loosely distributed patterns, which leads to a narrow common process window. The lighting conditions suitable for the exposure of densely distributed patterns may not be suitable for the exposure of loosely distributed patterns. To solve the technical challenge, exposure-auxiliary patterns may be added.

Exposure-auxiliary patterns are some patterns that are very small in size and are placed around the loosely distributed patterns to make the loosely distributed patterns look like densely distributed from an optical perspective. The minimum size of these auxiliary patterns must be smaller than the resolution of the lithography system. During the exposure process, these auxiliary patterns only scatter light without forming any image on the photoresist. Therefore, the exposure-auxiliary patterns are also called sub-resolution auxiliary patterns or scattering bar.

However, as the design size of the chip patterns becomes smaller and smaller, the critical dimension (CD) of the chip patterns is very close to the CD of the auxiliary patterns, such that during the exposure process, not only the chip patterns are exposed to form photolithography patterns, but also the auxiliary patterns are likely to be exposed to form an image on the photoresist. As such, the actual patterns formed on the photoresist may be different from the designed patterns. The disclosed methods for correcting mask patterns are directed to solve one or more problems set forth above and other problems in the art.

BRIEF SUMMARY OF THE DISCLOSURE

One aspect of the present disclosure provides a method for correcting mask patterns. The method includes providing a target layout, including a plurality of main patterns; dividing the target layout into a plurality of first regions along a first direction; acquiring position information of each first region of the plurality of first regions; acquiring a first model of each first region according to the position information of the first region; acquiring pattern parameters of auxiliary patterns around each main pattern of the first region; and arranging, around each main pattern, the auxiliary patterns of the main pattern according to the pattern parameters of the auxiliary patterns.

Optionally, acquiring the position information of each first region of the plurality of first regions includes setting a coordinate system, including a first coordinate axis long the first direction; and acquiring a coordinate of a center point of each first region on the first coordinate axis.

Optionally, the first model includes light-field information for exposing the target layout in the first region. The light-field information includes an azimuthal angle of incident light beams.

Optionally, the auxiliary patterns of each main pattern include a plurality of scattering bars, each including a long side and a short side. The first model of each main pattern of an $i^{th}$ first region includes $PW_i=F(\Phi_i, W_i, O_i, L_i, P_i)$; and $W_i$ is greater than or equal to a preset value. $PW_i$ is a process window parameter corresponding to the process window size of each main pattern of the $i^{th}$ first region, and $\Phi_i$, $W_i$, $O_i$, $L_i$, and $P_i$ are pattern parameters of the plurality of scattering bars of each main pattern of the $i^{th}$ first region. The pattern parameter $\Phi_i$ is an included angle between the long side of each scattering bar of the plurality of scattering bars and the first direction. The pattern parameter $W_i$ is a length of the short side of each scattering bar of the plurality of scattering bars. The pattern parameter $O_i$ is a minimum distance between a center of each scattering bar of the plurality of scattering bars and an outline of the main pattern. The pattern parameter $L_i$ is a length of the long side of each scattering bar of the plurality of scattering bars. The pattern parameter $P_i$ is a period of the plurality of scattering bars.

Optionally, the pattern parameter $W_i$, the pattern parameter $O_i$, the pattern parameter $L_i$, and the pattern parameter $P_i$ have preset values, and acquiring the pattern parameters of the auxiliary patterns of the main pattern according to the first model includes calculating a value of a derivative of the process window parameter $PW_i$ with respect to the pattern parameter $\Phi_i$ at zero value to obtain a value of the pattern parameter $\Phi_i$.

Further, arranging, around each main pattern, the auxiliary patterns of the main pattern further includes when the pattern parameter $\Phi_i$ is less than or equal to 22.5°, or greater than 157.5°, arranging the auxiliary patterns using 0° as the pattern parameter $\Phi_i$; when the pattern parameter $\Phi_i$ is greater than 22.5° but less than or equal to 67.5°, arranging the auxiliary patterns using 45° as the pattern parameter $\Phi_i$; when the pattern parameter $\Phi_i$ is greater than 67.5° but less than or equal to 112.5°, arranging the auxiliary patterns using 90° as the pattern parameter $\Phi_i$; and when the pattern parameter $\Phi_i$ is greater than 112.5° but less than or equal to 157.5°, arranging the auxiliary patterns using 135° as the pattern parameter $\Phi_i$.

Further, the shape of the long side of the scattering bar is a zigzag shape; the edge of the zigzag-shaped long side is formed by a plurality of first edges parallel to the first direction and a plurality of second edges perpendicular to the first direction, the plurality of first edges and the plurality of second edges are connected together in an end-to-end manner; and an included angle between a line connecting both ends of the zigzag-shaped long side and the first direction is the pattern parameter $\Phi_i$.

Optionally, the pattern parameter $O_i$, the pattern parameter $L_i$, and the pattern parameter $P_i$ have preset values, and acquiring the pattern parameters of the auxiliary patterns of the main pattern according to the first model includes calculating a value of a partial derivative of the process window parameter $PW_i$ with respect to the pattern parameter $\Phi_i$ at zero value to obtain a value of the pattern parameter $\Phi_i$; and calculating a value of a partial derivative of the process window parameter $PW_i$ with respect to the pattern parameter $W_i$ at zero value to obtain a value of the pattern parameter $W_i$.

Further, arranging, around each main pattern, the auxiliary patterns of the main pattern further includes when the pattern parameter $\Phi_i$ is less than or equal to 22.5°, or greater than 157.5°, arranging the auxiliary patterns using 0° as the pattern parameter $\Phi_i$; when the pattern parameter $\Phi_i$ is greater than 22.5° but less than or equal to 67.5°, arranging the auxiliary patterns using 45° as the pattern parameter $\Phi_i$; when the pattern parameter $\Phi_i$ is greater than 67.5° but less than or equal to 112.5°, arranging the auxiliary patterns using 90° as the pattern parameter $\Phi_i$; and when the pattern parameter $\Phi_i$ is greater than 112.5° but less than or equal to 157.5°, arranging the auxiliary patterns using 135° as the pattern parameter $\Phi_i$.

Further, the shape of the long side of the scattering bar is a zigzag shape; the edge of the zigzag-shaped long side is formed by a plurality of first edges parallel to the first direction and a plurality of second edges perpendicular to the first direction, the plurality of first edges and the plurality of second edges are connected together in an end-to-end manner; and an included angle between a line connecting both ends of the zigzag-shaped long side and the first direction is the pattern parameter $\Phi_i$.

Optionally, one or two of the pattern parameter $O_i$, the pattern parameter $L_i$, and the pattern parameter $P_i$ have preset values, and acquiring the pattern parameters of the auxiliary patterns of the main pattern according to the first model includes calculating a value of a partial derivative of the process window parameter $PW_i$ with respect to each variable pattern parameter of the pattern parameter $O_i$, the pattern parameter $L_i$, and the pattern parameter $P_i$ at zero value to obtain a value of the variable pattern parameter.

Further, arranging, around each main pattern, the auxiliary patterns of the main pattern further includes when the pattern parameter $\Phi_i$ is less than or equal to 22.5°, or greater than 157.5°, arranging the auxiliary patterns using 0° as the pattern parameter $\Phi_i$; when the pattern parameter $\Phi_i$ is greater than 22.5° but less than or equal to 67.5°, arranging the auxiliary patterns using 45° as the pattern parameter $\Phi_i$; when the pattern parameter $\Phi_i$ is greater than 67.5° but less than or equal to 112.5°, arranging the auxiliary patterns using 90° as the pattern parameter $\Phi_i$; and when the pattern parameter $\Phi_i$ is greater than 112.5° but less than or equal to 157.5°, arranging the auxiliary patterns using 135° as the pattern parameter $\Phi_i$.

Further, the shape of the long side of the scattering bar is a zigzag shape; the edge of the zigzag-shaped long side is formed by a plurality of first edges parallel to the first direction and a plurality of second edges perpendicular to the first direction, the plurality of first edges and the plurality of second edges are connected together in an end-to-end manner; and an included angle between a line connecting both ends of the zigzag-shaped long side and the first direction is the pattern parameter $\Phi_i$.

Optionally, acquiring the pattern parameters of the auxiliary patterns of the main pattern according to the first model includes calculating a value of a partial derivative of the process window parameter $PW_i$ with respect to the pattern parameter $\Phi_i$ at zero value to obtain a value of the pattern parameter $\Phi_i$; calculating a value of a partial derivative of the process window parameter $PW_i$ with respect to the pattern parameter $W_i$ at zero value to obtain a value of the pattern parameter $W_i$; calculating a value of a partial derivative of the process window parameter $PW_i$ with respect to the pattern parameter $O_i$ at zero value to obtain a value of the pattern parameter $O_i$; calculating a value of a partial derivative of the process window parameter $PW_i$ with respect to the pattern parameter $L_i$ at zero value to obtain a value of the pattern parameter $L_i$; and calculating a value of a partial derivative of the process window parameter $PW_i$ with respect to the pattern parameter $P_i$ at zero value to obtain a value of the pattern parameter $P_i$.

Further, arranging, around each main pattern, the auxiliary patterns of the main pattern further includes when the pattern parameter $\Phi_i$ is less than or equal to 22.5°, or greater than 157.5°, arranging the auxiliary patterns using 0° as the pattern parameter $\Phi_i$; when the pattern parameter $\Phi_i$ is greater than 22.5° but less than or equal to 67.5°, arranging the auxiliary patterns using 45° as the pattern parameter $\Phi_i$; when the pattern parameter $\Phi_i$ is greater than 67.5° but less than or equal to 112.5°, arranging the auxiliary patterns using 90° as the pattern parameter $\Phi_i$; and when the pattern parameter $\Phi_i$ is greater than 112.5° but less than or equal to 157.5°, arranging the auxiliary patterns using 135° as the pattern parameter $\Phi_i$.

Further, the shape of the long side of the scattering bar is a zigzag shape; the edge of the zigzag-shaped long side is formed by a plurality of first edges parallel to the first direction and a plurality of second edges perpendicular to the first direction, the plurality of first edges and the plurality of second edges are connected together in an end-to-end manner; and an included angle between a line connecting both ends of the zigzag-shaped long side and the first direction is the pattern parameter $\Phi_i$.

Optionally, in the $i^{th}$ first region, when a main pattern corresponding to the first model has a rectangular shape, the pattern parameter $P_i$ includes a pattern parameter $P_{i1}$ and a pattern parameter $P_{i2}$. The pattern parameter $P_{i1}$ is a period of the auxiliary patterns adjacent to the long side of the main pattern; and the pattern parameter $P_{i2}$ is a period of the auxiliary patterns adjacent to the short side of the main pattern.

Optionally, the pattern parameter $W_i$ is in a range of approximately 5 nm to 30 nm.

Optionally, the method further includes after arranging, around each main pattern, the auxiliary patterns of the main pattern according to the pattern parameters of the auxiliary patterns, performing optical proximity correction on the target layout.

Another aspect of the present disclosure provides a mask. The mask includes a target layout, including a plurality of main patterns; and auxiliary patterns, arranged around each main pattern according to pattern parameters obtained by dividing the target layout into a plurality of first regions along a first direction, acquiring position information of each first region of the plurality of first regions, acquiring a first model of each first region according to the position information of the first region, and acquiring the pattern parameters of the auxiliary patterns around each main pattern of the first region.

Compared to existing methods, the disclosed methods for correcting mask patterns may demonstrate the following exemplary advantages.

According to the disclosed method for correcting mask patterns, a target layout is used to form a mask in a subsequent process. In a subsequent mask exposure process after the mask is formed, the incident light beams irradiated onto the mask has an included angle with respect to the normal line perpendicular to the surface of the mask. However, rotating around the normal line, the incident light beams may have different azimuthal angles with respect to the first direction. In addition, in the subsequent exposure process, according to the different incident positions along the first direction, the incident light beams have different azimuthal angles, that is, when the incident light beams are irradiated onto the mask, along the first direction, the incident light beams have different azimuthal angles according to different positions of the incident points on the mask. On the one hand, since the target layout is divided into a plurality of first regions along the first direction, and a first model of each first region is obtained according to the position information of the first region. Therefore, corresponding to the variations in the light-field information along the first direction, that is, corresponding to different intensities and azimuthal angles of the incident light beams at different positions on the first direction, the light-field information included in the first model may be more accurate, that is, the first model may include more accurate light-field information of the first region. On the other hand, since the pattern parameters of the auxiliary patterns around each main pattern in the first region are acquired according to the first model, the pattern parameters of the auxiliary patterns may be adjusted for incident light beams with different intensities and azimuthal angles. In the subsequent exposure process, the actual effective CD of the auxiliary patterns may be reduced, and thus the size difference between the effective CD of the auxiliary patterns and the CD of the main pattern may be increased to reduce the probability of the auxiliary patterns being exposed, and thus make the auxiliary patterns unlikely exposed.

Further, because when the included angle between the long side of the scattering bar and the incident light beam is closer to the right angle, the smaller the effective CD of the scattering bar is, the less likely the scattering bar is to be exposed, which may be conducive to increasing the process window. Therefore, by calculating the partial derivative of the process window parameter $PW_i$ with respect to $\Phi_i$ at zero value, e.g., by calculating the pattern parameter $\Phi_i$ when the process window is the largest, the included angle between the long side of the subsequently-set scattering bar and the incident light beams of the $i^{th}$ first region may be a right angle or close to a right angle. That is, the value of the pattern parameter $\Phi_i$ may be a value that makes the scattering bar least likely to be exposed. Therefore, arranging the scattering bar according to the value of the pattern parameter $\Phi_i$ may be able to reduce the actual effective CD of the auxiliary patterns, increase the difference between the effective CD of the scattering bar and the CD of the main pattern, and reduce the probability of the auxiliary patterns being exposed, thereby making the auxiliary patterns unlikely exposed.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the present disclosure, which are illustrated in the accompanying drawings. Wherever possible, the same reference numbers will be used throughout the drawings to refer to the same or like parts.

As the design size of the chip patterns becomes smaller and smaller, the critical dimension (CD) of the chip patterns is very close to the CD of the auxiliary patterns, such that during the exposure process, not only the chip patterns are exposed to form photolithography patterns, but also the auxiliary patterns are likely to be exposed to form an image on the photoresist. As such, the actual patterns formed on the photoresist may be different from the designed patterns.

In order to make the auxiliary patterns unlikely exposed, a method provided is to reduce the CD of the auxiliary patterns and increase the size difference between the CD of the chip patterns and the CD of the auxiliary patterns.

However, due to the limitations of the exposure process, and also in order to avoid forming defects, such as bridges between different patterns, during the exposure process, certain restrictions, e.g., a preset mask rule check (MRC), may be applied when designing chip patterns and auxiliary patterns. When designing the mask patterns, the MRC may put limits to various sizes, such as the CD of chip patterns, the CD of auxiliary patterns, the distance between patterns etc. Therefore, when the CD of the auxiliary patterns is close to the minimum pattern size according to the MRC, the size of auxiliary patterns may not be further reduced. As such, the auxiliary patterns may not be easily exposed. In one embodiment, the MRC may include a preset value consistent with the CD of auxiliary patterns.

The present disclosure provides a method for correcting mask patterns. The method for correcting mask patterns includes providing a target layout, the target layout including a plurality of main patterns; dividing the target layout into a number of first regions along a first direction; acquiring the position information of each of the first regions; acquiring, according to the position information of each first region, a first model of the first region; acquiring, according to the first model, the pattern parameters of auxiliary patterns around each main pattern of the first region; and arranging, according to the pattern parameters of the auxiliary patterns of each main pattern, the auxiliary patterns around each main pattern. The method for correcting mask patterns may be able to ensure that the auxiliary patterns are not easily exposed.

To make the aforementioned objectives, features, and beneficial effects of the present disclosure more comprehensible, specific embodiments of the present disclosure are described in detail with reference to the accompanying drawings.

Figure 1:
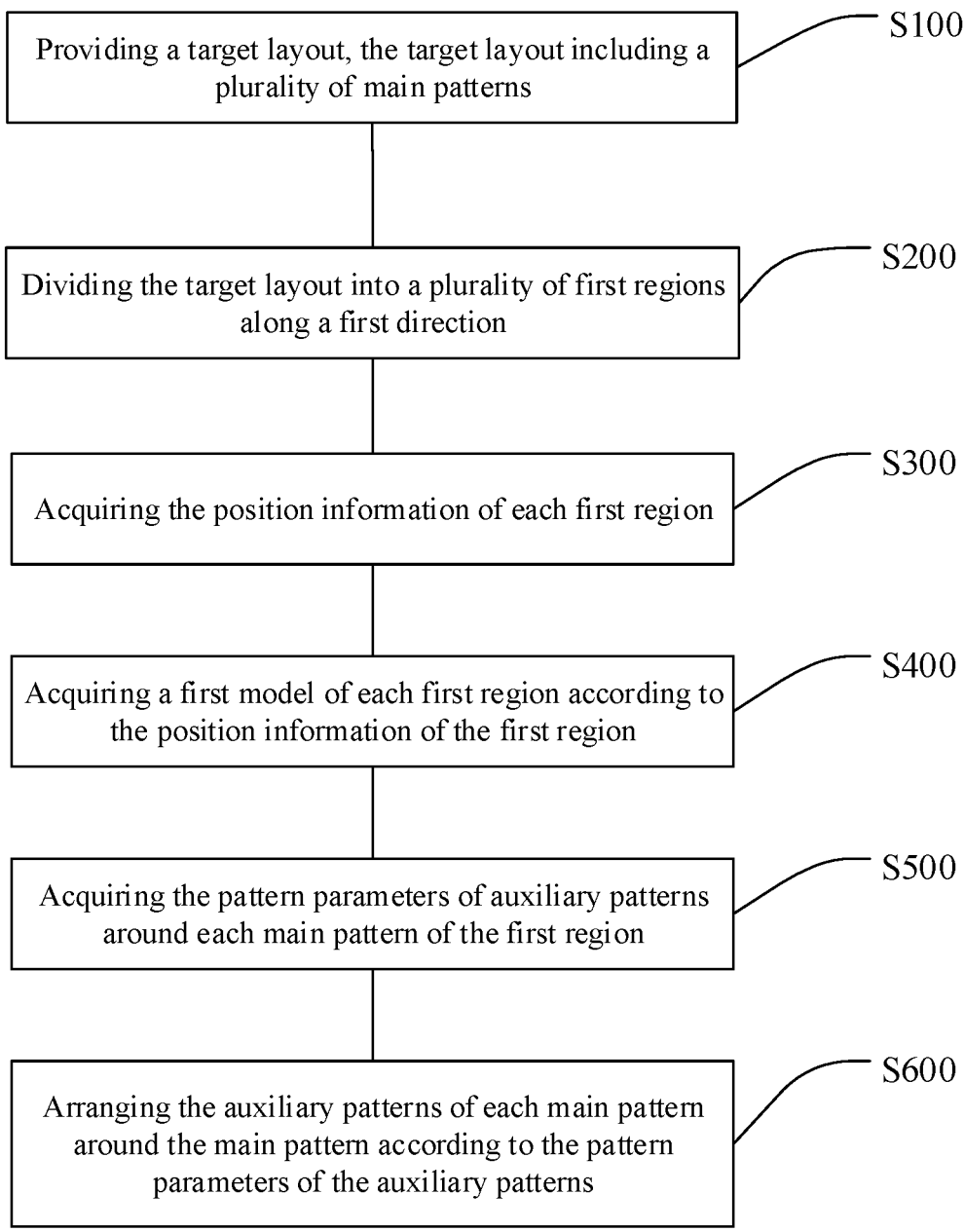
FIG. 1 illustrates a schematic flowchart of an exemplary method for correcting mask patterns consistent with some embodiments of the present disclosure.

FIG. 1 illustrates a schematic flowchart of an exemplary method for correcting mask patterns consistent with some embodiments of the present disclosure. FIGS. 2-6 illustrate schematic structural views at certain stages of the exemplary method.

Figure 2:
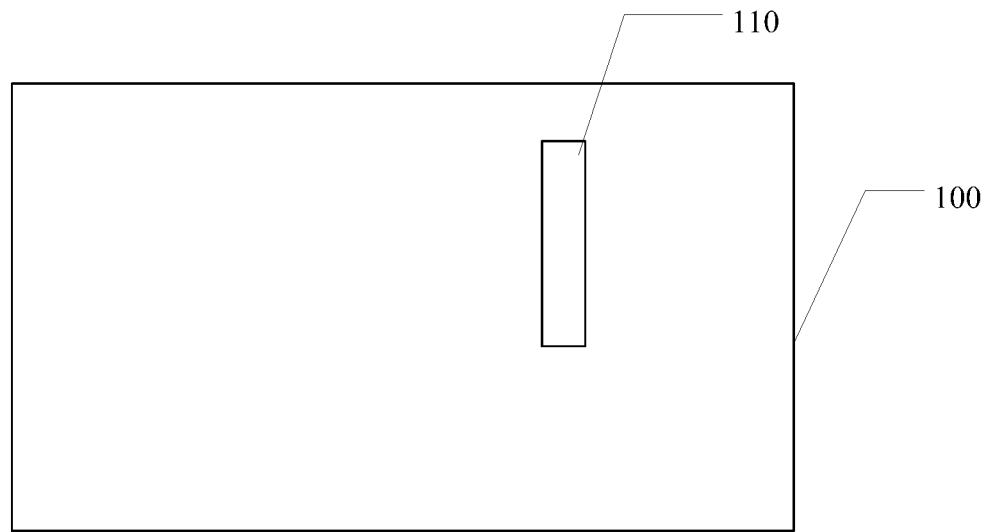
FIGS. 2-6 illustrate schematic structural views at certain stages of an exemplary method for correcting mask patterns consistent with some embodiments of the present disclosure.

Referring to FIG. 1, in S100, a target layout may be provided, and the target layout may include a plurality of main patterns. FIG. 2 illustrates a schematic structural view according to various embodiments of the present disclosure.

Referring to FIG. 2, a target layout 100 may be provided, and the target layout 100 may include a plurality of main patterns 110. The target layout 100 may be used to form a mask layout, and the mask layout may include a plurality of mask patterns.

The plurality of main patterns 110 may be used to form the plurality of mask patterns. In addition, during the photolithography process of transferring the mask layout to a wafer, the plurality of mask patterns formed by the plurality of main patterns 110 may need to be exposed.

It should be noted that for illustrative purposes, only one main pattern 110 among the plurality of main patterns 110 is shown to provide an example for further description of the disclosed method. In addition, the plurality of main patterns 110 may have different shapes.

Figure 3:
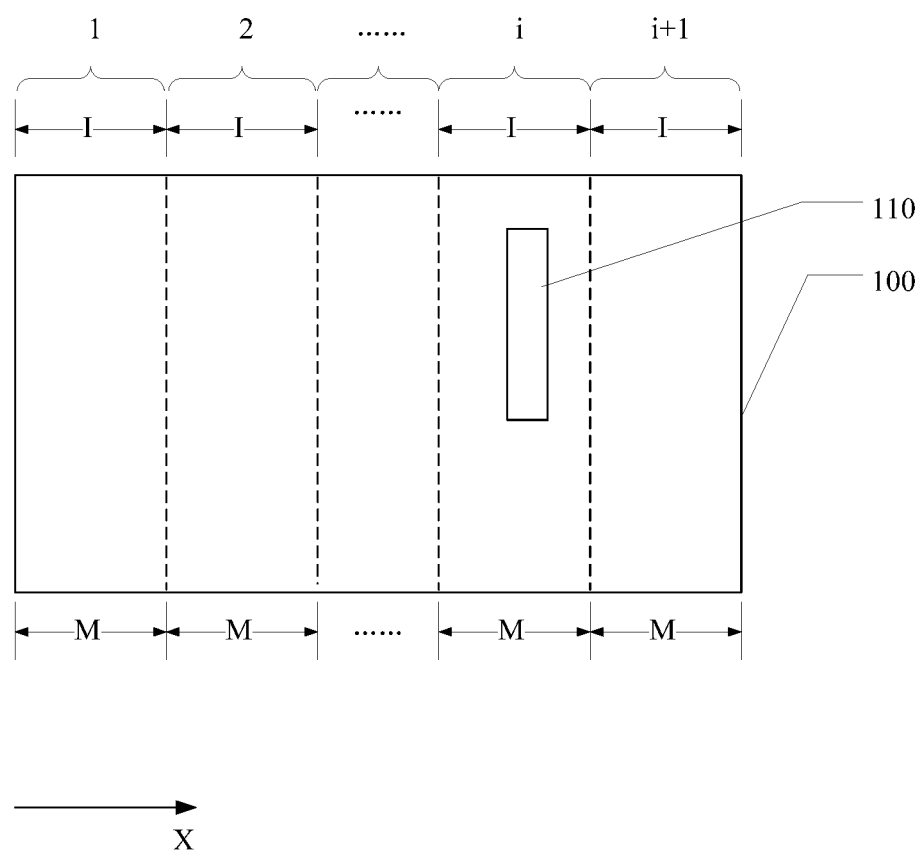

Further, returning to FIG. 1, in S200, the target layout may be divided into a plurality of first regions along a first direction. FIG. 3 illustrates a schematic structural view according to various embodiments of the present disclosure.

Referring to FIG. 3, the target layout 100 may be divided into a plurality of first regions I along a first direction X. In one embodiment, after dividing the target layout 100 into a plurality of first regions I, the target layout 100 may include, along the first direction X, a $1^{st}$ first region I, a $2^{nd}$ first region I, ..., an $i^{th}$ first region I, and an $(i+1)^{th}$ first region I.

In one embodiment, along the first direction X, each first region I may have a same width M. In other embodiments, along the first direction, the plurality of first regions I may have different widths.

The first direction X may be a preset direction, and in a subsequent photolithography process, at different incident positions along the first direction X, light beams with different incident azimuthal angles may be used to expose the mask to transfer the patterns of the mask to the wafer.

It should be noted that, during the photolithography process, the light beams irradiated onto the mask may have a fixed included angle with respect to the normal line perpendicular to the surface of the mask. The included angle may be the incident angle of the incident light beams. In the meantime, rotating around the normal line, the incident light beams may have different azimuthal angles with respect to the first direction X.

Figure 4:
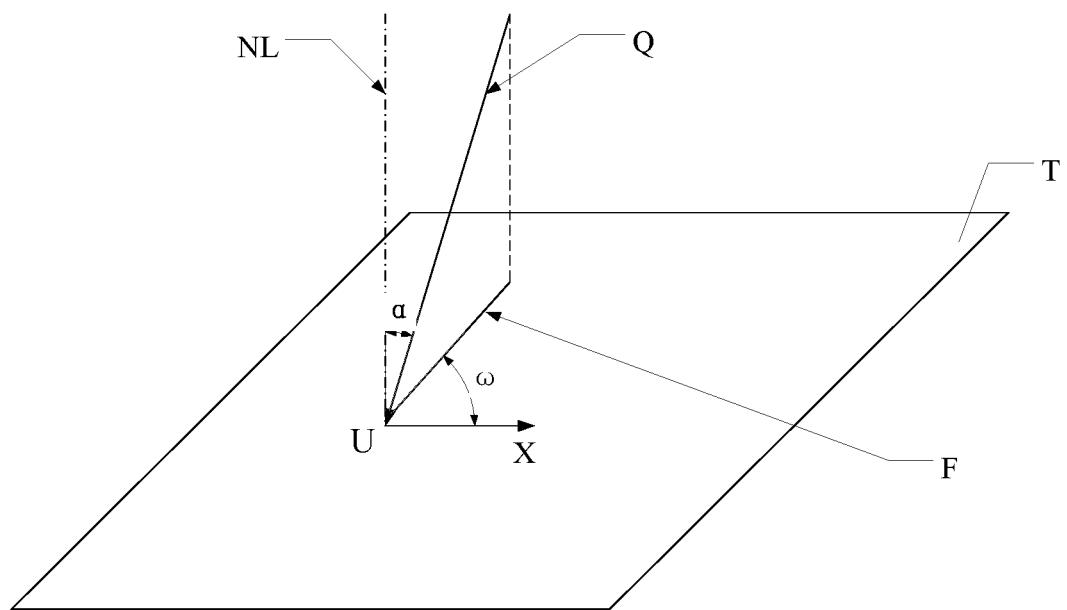

FIG. 4 illustrates a schematic structural diagram of incident light beams being irradiated onto a mask. Referring to FIG. 4, during the photolithography process, incident beams are irradiated onto the mask, thereby exposing the mask patterns to transfer the mask patterns to the wafer.

It should be noted that FIG. 4 schematically shows only one incident light beam Q, and also schematically indicates the incident surface T on the mask where the incident point U is located, so as to facilitate the description of the incident angle and the azimuthal angle of the incident light beams.

The incident light beam Q is incident on the incident point U on the mask. The incident light beam Q and the normal line NL perpendicular to the incident surface T may form a fixed included angle α, and the included angle α may be the incident angle of the incident light beam Q.

The incident light beam Q may have a projection F on the incident surface T, and the projection F may have an included angle ω with respect to the first direction X. The included angle ω may be the azimuthal angle of the incident light beam Q.

When the incident light beam Q rotates around the normal line NL, the incident light beam Q may have a different projection F on the incident surface T, and different included angle ω. That is, the incident light beam Q may have different azimuthal angles with respect to the first direction X when rotating around the normal line NL.

The included angle ω (the azimuthal angle of the incident light beam Q) may vary according to different incident positions along the first direction X (different incident points along the first direction X). That is, the position of the incident point along the first direction X may determine the azimuthal angle of the incident light beam Q.

Therefore, the incident light beams irradiated onto the mask may have a fixed included angle with respect to the normal line perpendicular to the surface of the mask, and at the same time, the incident light beams may have different azimuthal angles with respect to the first direction X when rotating around the normal line.

Figure 5:
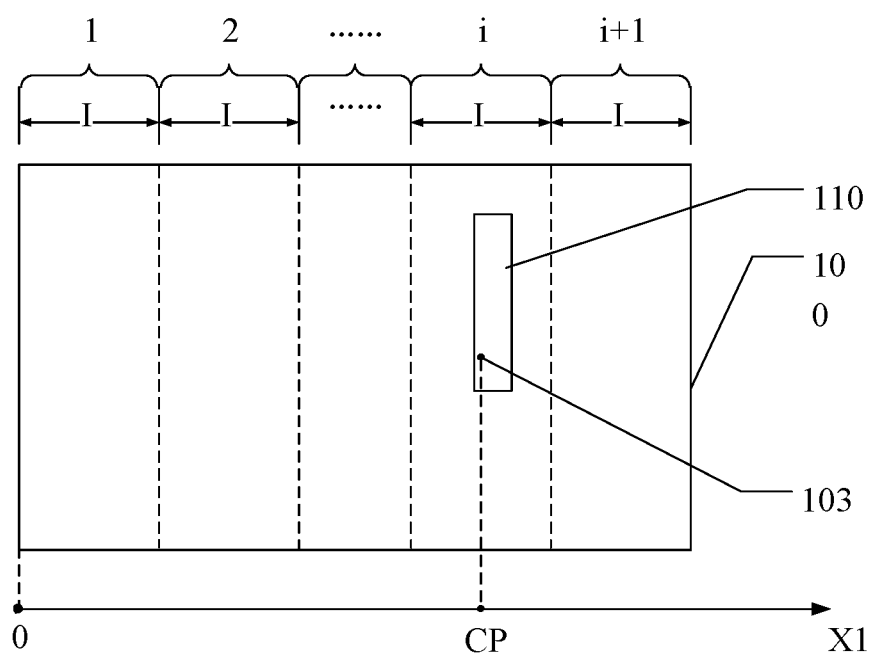

Returning to FIG. 1, in S300, position information of each first region may be acquired. FIG. 5 illustrates a schematic diagram of acquiring the position information of each first region.

Referring to FIG. 5, the position information of each first region I may be acquired. The method for acquiring the position information of each first region I may include setting a coordinate system, the coordinate system including a first coordinate axis X1 along the first direction X; and acquiring the coordinate of the center point 103 of each first region I on the first coordinate axis X1.

It should be noted that FIG. 5 schematically shows only the center point 103 of the $i^{th}$ first region I. In one embodiment, the starting position of the $1^{st}$ first region I of the target layout may be taken as the zero point of the first coordinate axis X1.

Taking the center point 103 of the $i^{th}$ first region I as an example, in one embodiment, because the width of each first region I is M, the coordinate CP of the center point 103 on the first coordinate axis X1 may be $(i-1+½)×M$.

In one embodiment, the coordinate CP of the center point 103 of each first region I on the first coordinate axis X1 may be the position information of the first region I on the first coordinate axis X1.

In other embodiments, the coordinate of the start position of each first region or the coordinate of the end position of each first region may be the position information of the first region on the first coordinate axis.

Figure 6:
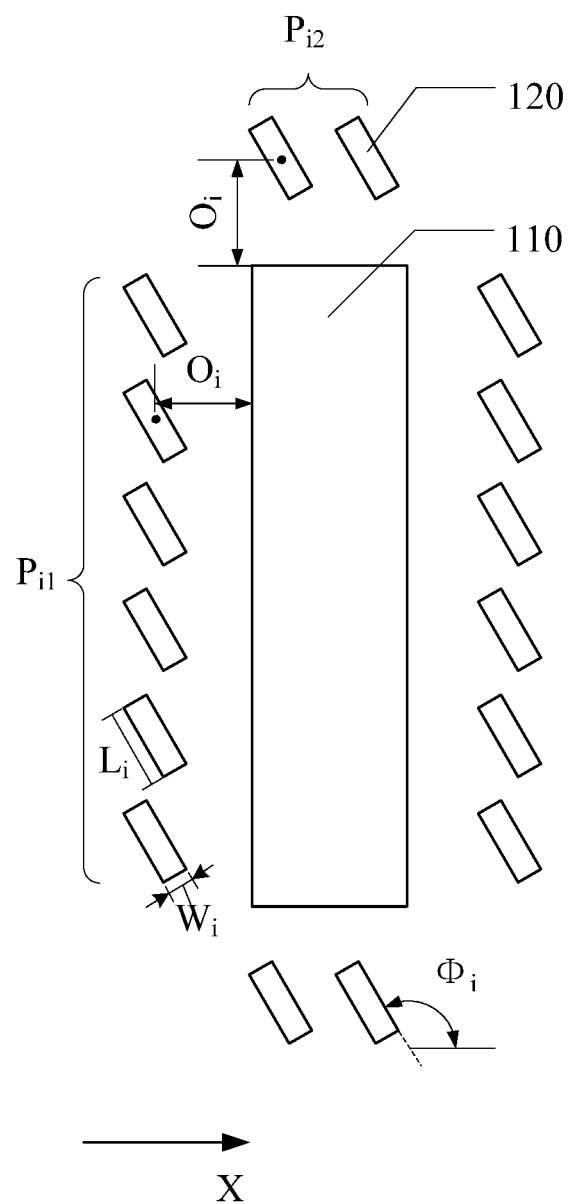

Further, returning to FIG. 1, in S400, a first model of each first region may be acquired according to the position information of the first region, and in S500, the pattern parameters of auxiliary patterns around each main pattern of the first region may be acquired according to the first model. FIG. 6 illustrates a schematic structural diagram of a main pattern and corresponding auxiliary patterns in the $i^{th}$ first region shown in FIG. 5.

Referring to FIG. 6, a first model of each first region I may be acquired according to the position information of the first region I; and the pattern parameters of auxiliary patterns around each main pattern 110 of the first region I may be acquired according to the first model.

The first model may include the light-field information for exposing the target layout 100 in the first region I, and the light-field information may include the azimuthal angle of incident light beams.

The first model of each first region I may be the functional relationship between the process window parameters of each main pattern 110 in the first region I and the pattern parameters of the auxiliary patterns 120 of the main pattern 110. The functional relationship may be determined by the light-field information. At the same time, because the azimuthal angle of the incident light beams in the light-field information varies with the position of the incident point, that is, the azimuthal angle is determined by the coordinate of the incident point on the first coordinate X1, by determining the position information of each first region I, the first model of each first region I may be determined.

In other embodiments, the light-field information may further include the light-intensity information of the incident light beams.

According to the method described above, the target layout 100 is divided into a number of first regions I along the first direction X, and the first model of the first region I is acquired according to the position information of each first region I. Therefore, corresponding to the variations in the light-field information along the first direction X, that is, corresponding to different intensities and azimuthal angles of the incident light beams at different positions on the first direction X, the light-field information included in the first model may be more accurate, that is, the first model may include more accurate light-field information of the first region I.

Moreover, because the pattern parameters of the auxiliary patterns around each main pattern 110 in the first region I are acquired according to the first model, the pattern parameters of the auxiliary patterns may be adjusted for incident light beams with different intensities and azimuthal angles. In a subsequent exposure process, the actual effective CD of the auxiliary patterns may be reduced, and thus the size difference between the effective CD of the auxiliary patterns and the CD of the main pattern may be increased to reduce the probability of the auxiliary patterns being exposed, and thus make the auxiliary patterns unlikely exposed.

The $i^{th}$ first region I may be taken as an example for illustration. In one embodiment, the azimuthal angle of the incident light beams with the center point 103 as the incident point may be acquired according to the coordinate CP of the center point 103 on the first coordinate axis X1. In addition, the first model of the ith first region I may be determined according to the azimuthal angle of the incident light beams with the center point 103 as the incident point.

It should be noted that the target layout 100 may be divided into a number of first regions I. When the number of the first regions I is larger, that is, the width M of the first region I becomes smaller, the azimuthal angle of the incident light beams irradiated to each incident point in the first region I may be closer to the azimuthal angle of the incident light beams with the center point 103 as the incident point. Therefore, by increasing the number of the first regions I, the accuracy of the subsequent first region may be improved.

In one embodiment, the auxiliary patterns of the main pattern 110 may include a plurality of scattering bars 120, and each scattering bar 120 may further include a long side and a short side. The auxiliary patterns are used to scatter the incident light beams, but are not used to form an image on the photoresist.

Further, taking the $i^{th}$ first region I as an example, the first model of each main pattern 110 of the $i^{th}$ first region I may include $PW_i = F(\Phi_i, W_i, O_i, L_i, P_i)$, and $W_i$ may be larger than or equal to the mask rule check (MRC), that is:

$$\begin{cases} PW_i = F(\phi_i, P_i, W_i, L_i, P_i) \\ W_i \geq MRC \end{cases}$$

where $PW_i$ is a process window parameter corresponding to the process window size of each main pattern 110 of the $i^{th}$ first region I, and $\Phi_i$, $W_i$, $O_i$, $L_i$, and $P_i$ are all pattern parameters of the plurality of scattering bars of each main pattern 110 of the $i^{th}$ first region I.

The pattern parameter $\Phi_i$ may be the included angle between the long side of each scattering bar 120 of the plurality of scattering bars 120 and the first direction X. The pattern parameter $W_i$ may be the length of the short side of each scattering bar 120 of the plurality of scattering bars 120. The pattern parameter $O_i$ may be the minimum distance between the center of each scattering bar 120 of the plurality of scattering bars 120 and the outline of the main pattern 110. The pattern parameter $L_i$ may be the length of the long side of each scattering bar 120 of the plurality of scattering bars 120. The pattern parameter $P_i$ may be the period of the plurality of scattering bars 120.

The period $P_i$ of the plurality of scattering bars 120 may refer to the number, as indicated by the period $P_i$, of scattering bars 120 with the above-mentioned pattern parameters $\Phi_i$, $W_i$, $O_i$, and $L_i$ that are evenly distributed around the main pattern 110.

In one embodiment, in the $i^{th}$ first region, the main pattern that corresponds to the first model may have a rectangular shape, and the pattern parameter $P_i$ may include a pattern parameter $P_{i1}$ and a pattern parameter $P_{i2}$. The pattern parameter $P_{i1}$ may be the period of the auxiliary patterns adjacent to the long side of the main pattern, and the pattern parameter $P_{i2}$ may be the period of the auxiliary patterns adjacent to the short side of the main pattern.

For example, the pattern parameter $P_{i1}$ may refer to the number, as indicated by the period $P_{i1}$, of scattering bars 120 with the above-mentioned pattern parameters $\Phi_1$, $W_i$, $O_i$, and $L_i$ that are evenly distributed around the long side of the main pattern 110, and the pattern parameter $P_{i2}$ may refer to the number, as indicated by the period $P_{i2}$, of scattering bars 120 with the above-mentioned pattern parameters $\Phi_i$, $W_i$, $O_i$, and $L_i$ that are evenly distributed around the short side of the main pattern 110.

The MRC may refer to rules, when designing mask patterns, used to restrict the CD of the main pattern 110 and the auxiliary patterns, the distance between the patterns, etc.

In one embodiment, the method for acquiring the pattern parameters of the auxiliary patterns of the main pattern 110 according to the first model may include: acquiring the value of the pattern parameter $\Phi_i$ by calculating the partial derivative of the process window parameter $PW_i$ with respect to the pattern parameter $\Phi_i$ at zero value; acquiring the value of the pattern parameter $W_i$ by calculating the partial derivative of the process window parameter $PW_i$ with respect to the pattern parameter $W_i$ at zero value; acquiring the value of the pattern parameter $O_i$ by calculating the partial derivative of the process window parameter $PW_i$ with respect to the pattern parameter $O_i$ at zero value; acquiring the value of the pattern parameter $L_i$ by calculating the partial derivative of the process window parameter $PW_i$ with respect to the pattern parameter $L_i$ at zero value; and acquiring the value of the pattern parameter $P_i$ by calculating the partial derivative of the process window parameter $PW_i$ with respect to the pattern parameter $P_i$ at zero value, that is:

$$\begin{cases} \dfrac{\partial PW_i}{\partial \Phi_i}\bigg|_{\Phi_{OPT}} = 0 \\ \dfrac{\partial PW_i}{\partial O_i}\bigg|_{O_{OPT}} = 0 \\ \dfrac{\partial PW_i}{\partial W_i}\bigg|_{W_{OPT}} = 0 \\ \dfrac{\partial PW_i}{\partial L_i}\bigg|_{L_{OPT}} = 0 \\ \dfrac{\partial PW_i}{\partial P_{i1}}\bigg|_{P_{1OPT}} = 0 \\ \dfrac{\partial PW_i}{\partial P_{i2}}\bigg|_{P_{2OPT}} = 0 \end{cases}$$

Therefore, by calculating the partial derivative of the process window parameter $PW_i$ with respect to each pattern parameter at zero value, that is, by simultaneously calculating the partial derivative of each pattern parameter at zero value when the process window parameter $PW_i$ is at the extreme value, the values of the pattern parameter $\Phi_i$, the pattern parameter $W_i$, the pattern parameter $O_i$, the pattern parameter $L_i$, the pattern parameter $P_{i1}$, and the pattern parameter $P_{i2}$ may be obtained.

Because the included angle $\Phi_i$ between the long side of the scattering bar 120 and the incident light beams is closer to the right angle, the smaller the effective CD of the scattering bar 120 is, the less likely the scattering bar 120 is to be exposed, which may be conducive to increasing the process window. Therefore, by calculating the partial derivative of the process window parameter $PW_i$ with respect to $\Phi_i$ at zero value, e.g., by calculating the pattern parameter $\Phi_i$ when the process window is the largest, the included angle between the long side of the subsequently-set scattering bar and the incident light beams of the $i^{th}$ first region may be a right angle or close to a right angle. That is, the value of the pattern parameter $\Phi_i$ may be a value that makes the scattering bar least likely to be exposed. Therefore, arranging the scattering bar 120 according to the value of the pattern parameter $\Phi_i$ may be able to reduce the actual effective CD of the auxiliary patterns, increase the difference between the effective CD of the scattering bar 120 and the CD of the main pattern 110, and reduce the probability of the auxiliary patterns being exposed, thereby making the auxiliary patterns unlikely exposed.

At the same time, since the process window of the main pattern 120 reaches the maximum, not only the acquired pattern parameter $\Phi_i$, but also the pattern parameter $W_i$, the pattern parameter $O_i$, the pattern parameter $L_i$, the pattern parameter $P_{i1}$, and the pattern parameter $P_{i2}$ may all have a value that can most effectively improve the value of the process window of the main pattern 120, that is, the value making the scattering bar 120 least likely exposed.

In one embodiment, the set of values of the pattern parameters that makes the scattering bar 120 least likely exposed may be an optimal set of values of the pattern parameters, and may be denoted as OPT. It should be noted that the OPT may refer to the values of all pattern parameters when the process window parameter $PW_i$ is maximum. That is, the values that the pattern parameters have when the process window of the main pattern 120 reaches the maximum.

In some other embodiments, the pattern parameter $W_i$, the pattern parameter $O_i$, the pattern parameter $L_i$, and the pattern parameter $P_i$ may all have preset values, and the method of acquiring the pattern parameters of the auxiliary patterns of the main pattern according to the first model may include: calculating the value of the derivative of the process window parameter $PW_i$ with respect to the pattern parameter $\Phi_i$ at zero value to obtain the value of the pattern parameter $\Phi_i$.

In some other embodiments, the pattern parameter $O_i$, the pattern parameter $L_i$, and the pattern parameter $P_i$ may all have preset values, and the method of acquiring the pattern parameters of the auxiliary patterns of the main pattern according to the first model may include: calculating the value of the partial derivative of the process window parameter $PW_i$ with respect to the pattern parameter $\Phi_i$ at zero value to obtain the value of the pattern parameter $\Phi_i$; and calculating the value of the partial derivative of the process window parameter $PW_i$ with respect to the pattern parameter $W_i$ at zero value to obtain the value of the pattern parameter $W_i$.

In some other embodiments, one or two of the pattern parameter $O_i$, the pattern parameter $L_i$, and the pattern parameter $P_i$ may all preset values, and the method of acquiring the pattern parameters of the auxiliary patterns of the main pattern according to the first model may include: separately calculating the partial derivative of the process window parameter $PW_i$ with respect to variable parameters among the pattern parameter $O_i$, the pattern parameter $L_i$, and the pattern parameter $P_i$ at zero value to obtain the values of the pattern parameters.

Further, returning to FIG. 1, in S600, the auxiliary patterns of each main pattern may be arranged around the main pattern according to the pattern parameters of the auxiliary patterns of the main pattern.

For example, after obtaining the pattern parameters of each auxiliary patterns 120, the auxiliary patterns of the main pattern 110 may be arranged around the main pattern 110 according to the pattern parameters of the auxiliary patterns of the main pattern 110.

In one embodiment, the auxiliary patterns, e.g., scattering bars 120 may be directly arranged according to the obtained pattern parameter $W_i$, pattern parameter $O_i$, pattern parameter $L_i$, pattern parameter $P_{i1}$, and pattern parameter $P_{i2}$.

In some other embodiments, the method of arranging, around each main pattern, the auxiliary patterns of the main pattern may further include: when the pattern parameter $\Phi_i$ is less than or equal to 22.5°, or greater than 157.5°, arranging the auxiliary patterns using 0° as the pattern parameter $\Phi_i$; when the pattern parameter $\Phi_i$ is greater than 22.5° but less than or equal to 67.5°, arranging the auxiliary patterns using 45° as the pattern parameter $\Phi_i$; when the pattern parameter $\Phi_i$ is greater than 67.5° but less than or equal to 112.5°, arranging the auxiliary patterns using 90° as the pattern parameter $\Phi_i$; and when the pattern parameter $\Phi_i$ is greater than 112.5° but less than or equal to 157.5°, arranging the auxiliary patterns using 135° as the pattern parameter $\Phi_i$.

Therefore, the pattern parameter $\Phi_i$ may only have four values (cases), namely 0°, 45°, 90°, and 135°, which reduces the possibility of the scattering bar 120 being exposed and reduces the complexity of the subsequent mask forming process.

Figure 7:
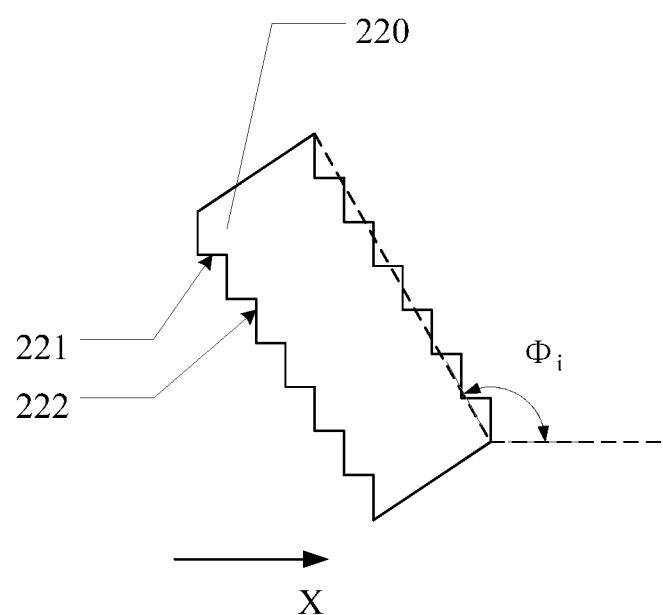
FIG. 7 illustrates a schematic structural diagram of an exemplary scattering bar consistent with some embodiments of the present disclosure.

Referring to FIG. 7, in some other embodiments, the shape of the long side of the scattering bar 220 may be a zigzag shape, and the edge of the zigzag-shaped long side may be formed by a plurality of first edges 221 parallel to the first direction X and a plurality of second edges 222 perpendicular to the first direction X. The plurality of first edges 221 and the plurality of second edges 222 may be connected together in an end-to-end manner. An included angle between a line connecting both ends of the zigzag-shaped long side and the first direction X may be the pattern parameter $\Phi_i$.

In one embodiment, the pattern parameter $W_i$ may be in a range of approximately 5 nm to 30 nm.

In one embodiment, after arranging the auxiliary patterns of each main pattern 110 around the main pattern 110, an optical proximity correction may be performed on the target layout 100.

The disclosed method for correcting mask patterns consistent with various disclosed embodiments may be used to fabricate a mask for a photolithography process. The photolithography process may include an exposure process, a development process after the exposure process, and an etching process after the development process. In the exposure process, light may be irradiated onto, e.g., a photoresist-coated silicon wafer through regions in the mask where light can pass through, and the coated photoresist may undergo chemical reactions under the irradiation of light. In the development process, photolithographic patterns may be formed by using the difference in the degree of dissolution of the exposed and unexposed photoresist in the developer, thus the mask patterns may be transferred from the mask to the photoresist to form a patterned photoresist layer. In the etching process, the silicon wafer may be etched using the patterned photoresist layer as an etch mask to form structures corresponding to the mask patterns. The mask patterns may be further transferred from the patterned photoresist layer to the silicon wafer.

As the design size continues to decrease, the design size is getting closer to the limits of a photolithography imaging system. The diffraction effect of light that results in an optical image degradation on the design pattern and leads to seriously distorted photolithographic pattern from the mask pattern, which may be avoided by using the disclosed mask pattern correction method. Since the auxiliary patterns arranged around the main patterns are determined using the disclosed method, the photolithography resolution may be improved, thus the photolithographic quality of the main patterns may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for correcting mask patterns, comprising:
   providing a target layout, wherein the target layout includes a plurality of main patterns;
   dividing the target layout into a plurality of first regions along a first direction;
   acquiring position information of each first region of the plurality of first regions;
   acquiring a first model of each first region according to the position information of the first region;
   acquiring pattern parameters of auxiliary patterns around each main pattern of the first region; and
   arranging, around each main pattern, the auxiliary patterns of the main pattern according to the pattern parameters of the auxiliary patterns.

2. The method according to claim 1, wherein acquiring the position information of each first region of the plurality of first regions includes:
   setting a coordinate system, including a first coordinate axis long the first direction; and
   acquiring a coordinate of a center point of each first region on the first coordinate axis.

3. The method according to claim 2, wherein:
   the first model includes light-field information for exposing the target layout in the first region, wherein the light-field information includes an azimuthal angle of incident light beams.

4. The method according to claim 3, wherein:
   the auxiliary patterns of each main pattern include a plurality of scattering bars, each including a long side and a short side, wherein:
   the first model of each main pattern of an $i^{th}$ first region includes $PW_i = F(\Phi_i, W_i, O_i, L_i, P_i)$; and
   $W_i$ is greater than or equal to a preset value, wherein:
   $PW_i$ is a process window parameter corresponding to the process window size of each main pattern of the $i^{th}$ first region, and $\Phi_i$, $W_i$, $O_i$, $L_i$, and $P_i$ are pattern parameters of the plurality of scattering bars of each main pattern of the $i^{th}$ first region,
   the pattern parameter $\Phi_i$ is an included angle between the long side of each scattering bar of the plurality of scattering bars and the first direction,
   the pattern parameter $W_i$ is a length of the short side of each scattering bar of the plurality of scattering bars,
   the pattern parameter $O_i$ is a minimum distance between a center of each scattering bar of the plurality of scattering bars and an outline of the main pattern,
   the pattern parameter $L_i$ is a length of the long side of each scattering bar of the plurality of scattering bars, and
   the pattern parameter $P_i$ is a period of the plurality of scattering bars.

5. The method according to claim 4, wherein the pattern parameter $W_i$, the pattern parameter $O_i$, the pattern parameter $L_i$, and the pattern parameter $P_i$ have preset values, and acquiring the pattern parameters of the auxiliary patterns of the main pattern according to the first model includes:
   calculating a value of a derivative of the process window parameter $PW_i$ with respect to the pattern parameter $\Phi_i$ at zero value to obtain a value of the pattern parameter $\Phi_i$.

6. The method according to claim 5, wherein arranging, around each main pattern, the auxiliary patterns of the main pattern further includes:
   when the pattern parameter $\Phi_i$ is less than or equal to 22.5°, or greater than 157.5°, arranging the auxiliary patterns using 0° as the pattern parameter $\Phi_i$;
   when the pattern parameter $\Phi_i$ is greater than 22.5° but less than or equal to 67.5°, arranging the auxiliary patterns using 45° as the pattern parameter $\Phi_i$;
   when the pattern parameter $\Phi_i$ is greater than 67.5° but less than or equal to 112.5°, arranging the auxiliary patterns using 90° as the pattern parameter $\Phi_i$; and
   when the pattern parameter $\Phi_i$ is greater than 112.5° but less than or equal to 157.5°, arranging the auxiliary patterns using 135° as the pattern parameter $\Phi_i$.

7. The method according to claim 5, wherein:
   a shape of the long side of the scattering bar is a zigzag shape;

an edge of the zigzag-shaped long side is formed by a plurality of first edges parallel to the first direction and a plurality of second edges perpendicular to the first direction, the plurality of first edges and the plurality of second edges are connected together in an end-to-end manner; and an included angle between a line connecting both ends of the zigzag-shaped long side and the first direction is the pattern parameter $\Phi_i$.

8. The method according to claim 4, wherein the pattern parameter $O_i$, the pattern parameter $L_i$, and the pattern parameter $P_i$ have preset values, and acquiring the pattern parameters of the auxiliary patterns of the main pattern according to the first model includes:

calculating a value of a partial derivative of the process window parameter $PW_i$ with respect to the pattern parameter $\Phi_i$ at zero value to obtain a value of the pattern parameter $\Phi_i$; and calculating a value of a partial derivative of the process window parameter $PW_i$ with respect to the pattern parameter $W_i$ at zero value to obtain a value of the pattern parameter $W_i$.

9. The method according to claim 8, wherein arranging, around each main pattern, the auxiliary patterns of the main pattern further includes:

when the pattern parameter $\Phi_i$ is less than or equal to 22.5°, or greater than 157.5°, arranging the auxiliary patterns using 0° as the pattern parameter $\Phi_i$;

when the pattern parameter $\Phi_i$ is greater than 22.5° but less than or equal to 67.5°, arranging the auxiliary patterns using 45° as the pattern parameter $\Phi_i$;

when the pattern parameter $\Phi_i$ is greater than 67.5° but less than or equal to 112.5°, arranging the auxiliary patterns using 90° as the pattern parameter $\Phi_i$; and when the pattern parameter $\Phi_i$ is greater than 112.5° but less than or equal to 157.5°, arranging the auxiliary patterns using 135° as the pattern parameter $\Phi_i$.

10. The method according to claim 8, wherein:

a shape of the long side of the scattering bar is a zigzag shape;

an edge of the zigzag-shaped long side is formed by a plurality of first edges parallel to the first direction and a plurality of second edges perpendicular to the first direction, the plurality of first edges and the plurality of second edges are connected together in an end-to-end manner; and an included angle between a line connecting both ends of the zigzag-shaped long side and the first direction is the pattern parameter $\Phi_i$.

11. The method according to claim 4, wherein one or two of the pattern parameter $O_i$, the pattern parameter $L_i$, and the pattern parameter $P_i$ have preset values, and acquiring the pattern parameters of the auxiliary patterns of the main pattern according to the first model includes:

calculating a value of a partial derivative of the process window parameter $PW_i$ with respect to each variable pattern parameter of the pattern parameter $O_i$, the pattern parameter $L_i$, and the pattern parameter $P_i$ at zero value to obtain a value of the variable pattern parameter.

12. The method according to claim 11, wherein arranging, around each main pattern, the auxiliary patterns of the main pattern further includes:

when the pattern parameter $\Phi_i$ is less than or equal to 22.5°, or greater than 157.5°, arranging the auxiliary patterns using 0° as the pattern parameter $\Phi_i$;

when the pattern parameter $\Phi_i$ is greater than 22.5° but less than or equal to 67.5°, arranging the auxiliary patterns using 45° as the pattern parameter $\Phi_i$;

when the pattern parameter $\Phi_i$ is greater than 67.5° but less than or equal to 112.5°, arranging the auxiliary patterns using 90° as the pattern parameter $\Phi_i$; and when the pattern parameter $\Phi_i$ is greater than 112.5° but less than or equal to 157.5°, arranging the auxiliary patterns using 135° as the pattern parameter $\Phi_i$.

13. The method according to claim 11, wherein:

a shape of the long side of the scattering bar is a zigzag shape;

an edge of the zigzag-shaped long side is formed by a plurality of first edges parallel to the first direction and a plurality of second edges perpendicular to the first direction, the plurality of first edges and the plurality of second edges are connected together in an end-to-end manner; and an included angle between a line connecting both ends of the zigzag-shaped long side and the first direction is the pattern parameter $\Phi_i$.

14. The method according to claim 4, wherein acquiring the pattern parameters of the auxiliary patterns of the main pattern according to the first model includes:

calculating a value of a partial derivative of the process window parameter $PW_i$ with respect to the pattern parameter $\Phi_i$ at zero value to obtain a value of the pattern parameter $\Phi_i$;

calculating a value of a partial derivative of the process window parameter $PW_i$ with respect to the pattern parameter $W_i$ at zero value to obtain a value of the pattern parameter $W_i$;

calculating a value of a partial derivative of the process window parameter $PW_i$ with respect to the pattern parameter $O_i$ at zero value to obtain a value of the pattern parameter $O_i$;

calculating a value of a partial derivative of the process window parameter $PW_i$ with respect to the pattern parameter $L_i$ at zero value to obtain a value of the pattern parameter $L_i$; and calculating a value of a partial derivative of the process window parameter $PW_i$ with respect to the pattern parameter $P_i$ at zero value to obtain a value of the pattern parameter $P_i$.

15. The method according to claim 14, wherein arranging, around each main pattern, the auxiliary patterns of the main pattern further includes:

when the pattern parameter $\Phi_i$ is less than or equal to 22.5°, or greater than 157.5°, arranging the auxiliary patterns using 0° as the pattern parameter $\Phi_i$;

when the pattern parameter $\Phi_i$ is greater than 22.5° but less than or equal to 67.5°, arranging the auxiliary patterns using 45° as the pattern parameter $\Phi_i$;

when the pattern parameter $\Phi_i$ is greater than 67.5° but less than or equal to 112.5°, arranging the auxiliary patterns using 90° as the pattern parameter $\Phi_i$; and when the pattern parameter $\Phi_i$ is greater than 112.5° but less than or equal to 157.5°, arranging the auxiliary patterns using 135° as the pattern parameter $\Phi_i$.

16. The method according to claim 14, wherein:

a shape of the long side of the scattering bar is a zigzag shape;

an edge of the zigzag-shaped long side is formed by a plurality of first edges parallel to the first direction and a plurality of second edges perpendicular to the first direction, the plurality of first edges and the plurality of second edges are connected together in an end-to-end manner; and an included angle between a line connecting both ends of the zigzag-shaped long side and the first direction is the pattern parameter $\Phi_i$.

17. The method according to claim 4, wherein:

in the $i^{th}$ first region, when a main pattern corresponding to the first model has a rectangular shape, the pattern parameter $P_i$ includes a pattern parameter $P_{i1}$ and a pattern parameter $P_{i2}$, wherein:

the pattern parameter $P_{i1}$ is a period of the auxiliary patterns adjacent to the long side of the main pattern; and the pattern parameter $P_{i2}$ is a period of the auxiliary patterns adjacent to the short side of the main pattern.

18. The method according to claim 4, wherein:

the pattern parameter $W_i$ is in a range of approximately 5 nm to 30 nm.

19. The method according to claim 1, further including:

after arranging, around each main pattern, the auxiliary patterns of the main pattern according to the pattern parameters of the auxiliary patterns, performing optical proximity correction on the target layout.

20. A mask, comprising:

a target layout, including a plurality of main patterns; and auxiliary patterns, arranged around each main pattern according to pattern parameters obtained by:

dividing the target layout into a plurality of first regions along a first direction, acquiring position information of each first region of the plurality of first regions, acquiring a first model of each first region according to the position information of the first region, and acquiring the pattern parameters of the auxiliary patterns around each main pattern of the first region.

\* \* \* \* \*